United States Patent
Bang et al.

(10) Patent No.: US 7,259,958 B2
(45) Date of Patent: Aug. 21, 2007

(54) DISPLAY APPARATUS HAVING STRESS-DIFFUSING MEANS

(75) Inventors: Heung-Chul Bang, Suwon-si (KR); Ki-Jung Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 170 days.

(21) Appl. No.: 10/952,893

(22) Filed: Sep. 28, 2004

(65) Prior Publication Data

US 2005/0174726 A1    Aug. 11, 2005

(30) Foreign Application Priority Data

Oct. 16, 2003    (KR) ...................... 10-2003-0072350

(51) Int. Cl.
 *G06F 1/16* (2006.01)
(52) U.S. Cl. .................. 361/681; 248/220.21; 403/388
(58) Field of Classification Search ................ 361/681, 361/825; 248/220.21, 220.22; 403/388, 403/408.1
See application file for complete search history.

(56) References Cited

U.S. PATENT DOCUMENTS 6,181,390 B1 *   1/2001   Wang et al. .................. 349/58
6,256,075 B1 *   7/2001   Yang .......................... 348/843
6,366,264 B1 *   4/2002   Kurumada .................... 345/60
6,560,124 B1 *   5/2003   Irie et al. ..................... 361/816
2002/0033436 A1 * 3/2002  Peng et al. .............. 248/284.1

FOREIGN PATENT DOCUMENTS

CN     1272634     11/2000

* cited by examiner

*Primary Examiner*—Lisa Lea-Edmonds
(74) *Attorney, Agent, or Firm*—Christie, Parker & Hale, LLP

(57) ABSTRACT

A display apparatus where external force concentrated on a chassis base via a boss is inhibited, and any stress applied to the boss is diffused. The display apparatus includes a display panel, a chassis base supporting the display panel, main brackets coupled to the chassis base opposite to the display panel to hold bosses, and sub-brackets provided at the chassis base adjacent to the main brackets. The boss held to the main bracket is inserted through the sub-bracket, and is supported thereby.

19 Claims, 3 Drawing Sheets

DISPLAY APPARATUS HAVING STRESS-DIFFUSING MEANS

CROSS REFERENCE TO RELATED APPLICATION

This application claims priority to and the benefit of Korean Patent Application No. 10-2003-0072350 filed on Oct. 16, 2003 in the Korean Intellectual Property Office, the entire content of which is incorporated herein by reference.

BACKGROUND OF THE INVENTION (a) Field of the Invention

The present invention relates to a display apparatus having a boss structure capable of diffusing stress applied to the boss and/or inhibiting external forces concentrated on a chassis base via the boss when, for example, the display apparatus is mounted on a wall or when it is fixed to a display panel module to a block-board.

(b) Description of Related Art

One common type of display apparatus is a plasma display apparatus. Typically the plasma display apparatus has a plasma display panel (referred to hereinafter as a "PDP"), a chassis base holding lateral and back surfaces of the PDP, a plurality of driving circuit boards mounted to the back surface thereof, a front cabinet placed at the front of the PDP, and a back cover placed at the rear of the chassis base. The front cabinet and the back cover may be combined into a single body by interposing the chassis base to form the entire exterior.

The PDP is a display device where phosphors are excited by ultraviolet rays generated through gas discharging within a vacuum vessel. Compared to a cathode ray tube (CRT), a PDP is typically thinner and flatter, making the formation of a high resolution wide screen possible.

The above-structured plasma display apparatus may be placed on the floor like a television or it is may be hung on the wall. When the plasma display apparatus is hung on a wall, it may be mounted via a wall-mounting boss combined with the chassis base, or fixed thereto by providing brackets at the four corners of the chassis base, combining a boss with the respective brackets, and coupling a coupling member with the boss. Further, when the PDP and the chassis base are packaged and delivered together to a set maker, the plasma display apparatus may be fixed to a fixation member such as a block-board by using a coupling member coupled to the boss.

However, in either of the above-described cases, external forces may be applied to the apparatus during transportation. Although it is possible to prevent external forces applied to the boss from being directly transmitted to the chassis base, large amounts of stress applied to the boss may not be able to be effectively diffused causing, for example, the boss to decouple from the bracket or causing black spots to be formed on the display screen of the PDP, thereby deteriorating display quality of the PDP.

SUMMARY OF THE INVENTION

One exemplary embodiment of the present invention provides a stress diffusing support bracket assembly for a mountable structure having a boss which inhibits external forces concentrated on the mountable structure, and wherein stress applied to the boss is diffused to prevent decoupling of the boss from the mountable structure, or otherwise damaging the mountable structure.

Another embodiment of the display apparatus may include a plasma display panel, a chassis base supporting the plasma display panel, and main brackets coupled to the chassis base opposite to the plasma display panel to hold bosses. Sub-brackets may also be provided at the chassis base close to the main brackets into which the bosses held by the main brackets may be inserted and supported thereby.

In one embodiment, the sub-bracket may have a through-hole into which the boss may be inserted and a reinforcing protrusion formed around a perimeter of the through-hole.

The main bracket may have a main bracket bent portion spacing the fitted portion of the boss away from the surface of the chassis base. Additionally, the sub-bracket may have a sub-bracket bent portion spacing the passed portion of the boss away from the main bracket bent portion of the main bracket.

The main bracket and the sub-bracket may be formed from either a metallic material or a plastic material. The sub-bracket may further be located perpendicular to the main bracket.

The chassis base may be combined with a front cabinet and a back cover to form a body, with the boss penetrating the back cover so that it protrudes therefrom.

The main bracket may be provided at the corners of the back surface of the chassis base. The boss may be tapped with female threads, and may have a grooved portion fitted to a hole formed at the main bracket in a pressed manner.

DETAILED DESCRIPTION

Figure 1:
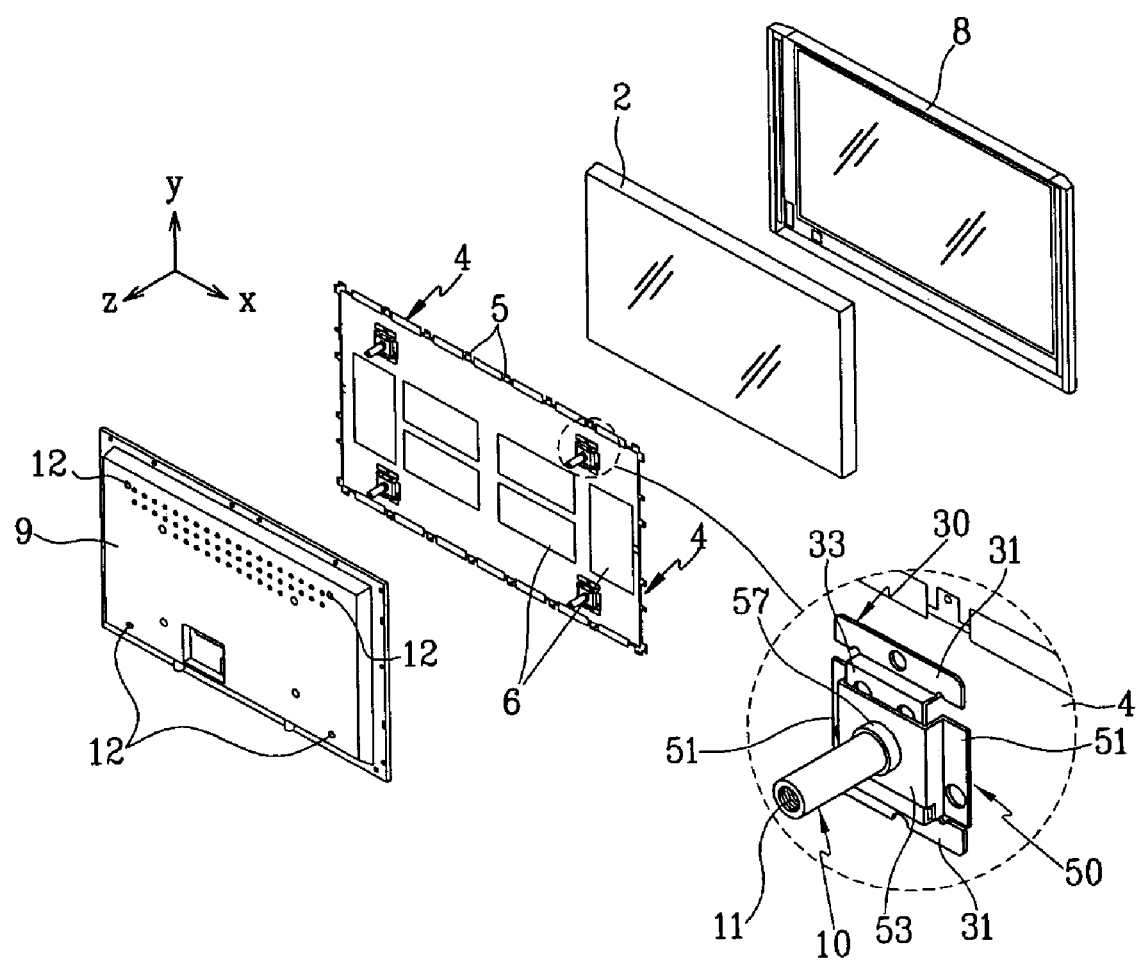
FIG. 1 is an exploded perspective view of a plasma display apparatus with a chassis base according to an embodiment of the present invention.

As shown in FIG. 1, the plasma display apparatus has a PDP 2 for displaying desired images by exciting phosphors with vacuum ultraviolet rays generated through internal gas discharging, a chassis base 4 holding the side and the back surfaces of the PDP 2, a plurality of driving circuit boards 6 mounted at the back surface of the chassis base 4, a front cabinet 8 placed on the front of the PDP 2, and a back cover 9 placed at the rear of the chassis base 4 to cover the driving circuit boards 6.

The chassis base 4 may be formed through die casting or pressing, and may have sufficient structural integrity to support the PDP 2. The chassis base 4 may be formed with a material or structure allowing a high thermal release, and may have a plurality of fixtures 5 on its periphery.

The front cabinet 8 may surround the chassis base 4 together with the back cover 9, and may be coupled to the fixtures 5 of the chassis base 4 with screws (not shown) to form the exterior of the plasma display apparatus.

The plasma display apparatus may be hung on the wall using a female thread-tapped boss 10 provided at the corners of the chassis base 4. Furthermore, when the PDP 2 and the chassis base 4 are combined with each other, the resulting PDP module may be fixed during the packaging process to a target fixation member using the bosses 10.

For this purpose, the plasma display apparatus has a double bracket structure to inhibit external forces concentrated on the chassis base 4 via the bosses 10, and to diffuse stress applied to the boss, thereby preventing the boss decoupling from the chassis base 4 and further preventing the formation of black spots on the display screen of the PDP 2. Therefore, the display quality of the PDP 2 is enhanced.

Figure 2:
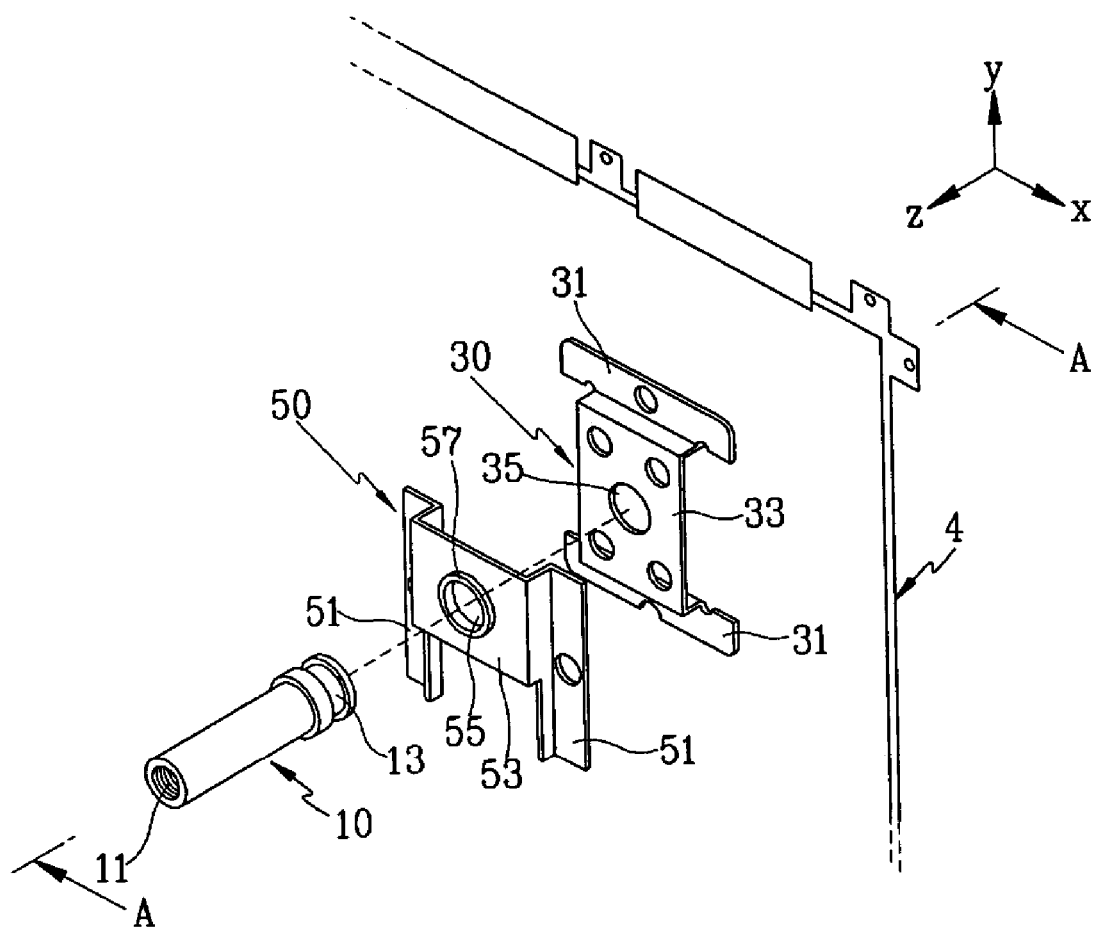
FIG. 2 is an exploded perspective view of the boss structure and a portion of the chassis base shown in FIG. 1.
Figure 3:
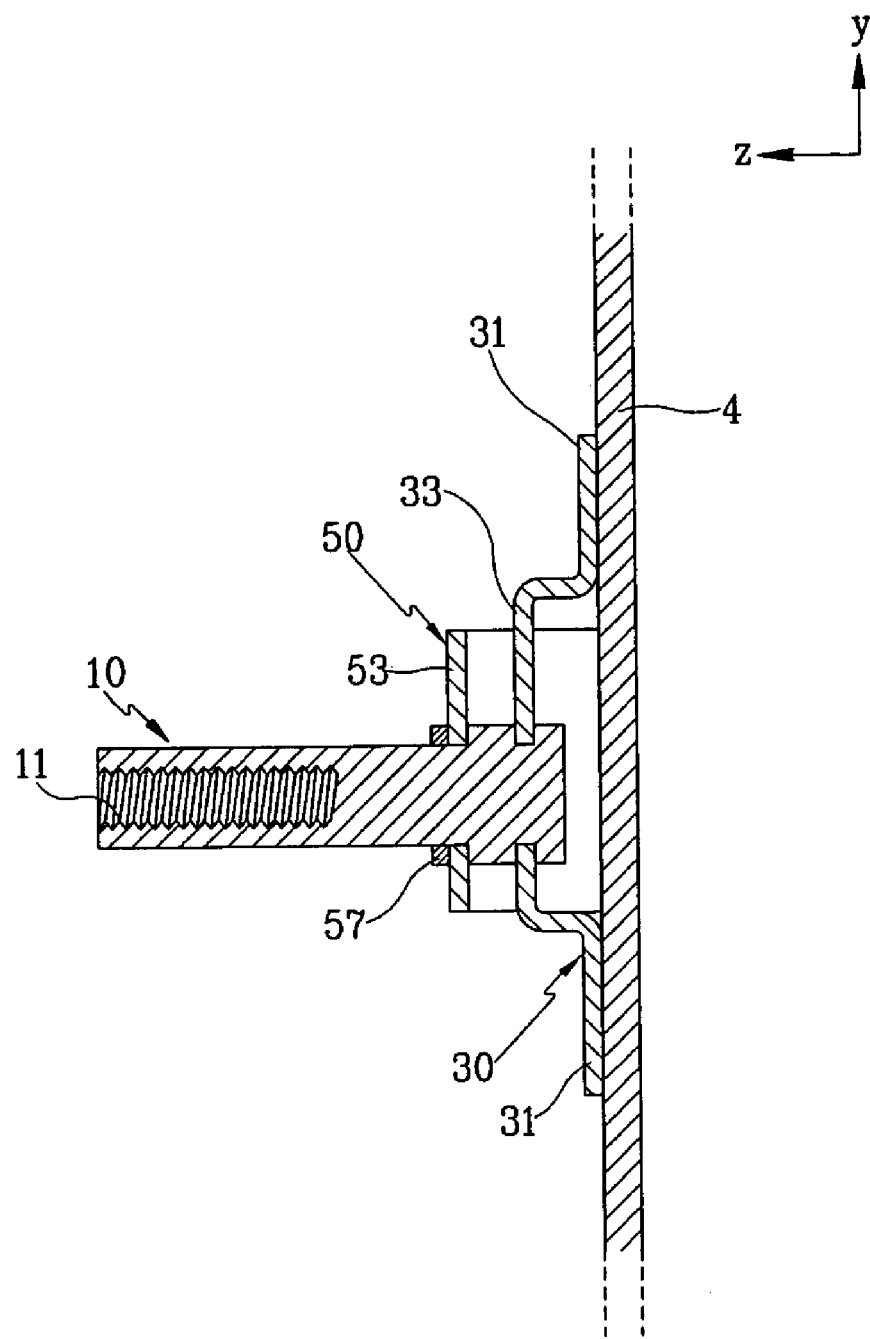
FIG. 3 is a sectional view of the boss structure and chassis base taken along section lines A-A of FIG. 2.

Referring now to FIGS. 2 and 3, in one exemplary embodiment of a plasma display apparatus according to the present invention, a main bracket 30 is fixed to a corner of the chassis base 4 to hold the boss 10, and a sub-bracket 50 is fixed to the chassis base 4 such that it is positioned near the main bracket 30 while at least partially covering the main bracket.

The boss 10 may be longitudinally formed with a cylindrical shape, and may have a female threaded portion 11 with a predetermined depth, to which a coupling member such as a screw may be coupled. The boss 10 may be formed from a plastic material or a metallic material and it may have a structure as is known in the art. For instance, the boss 10 may have a groove 13 at one end which may be fitted to the main bracket 30. The respective bosses 10 for mounting the plasma display apparatus on a wall may penetrate the back cover 9 fitted to the back surface of the chassis base 4, and protrude therefrom. A wall-mounting member may be provided at the female screwed portion 11 of the boss 10. Where the PDP 2 is combined with the chassis base 4 to be packaged and delivered together as a module to a set maker, the respective bosses 10 may serve to fix the module to a fixation member such as a block-board (not shown) by using a coupling member such as a screw. The coupling structure of the boss 10 prevents the module from being damaged by external impact or vibration during delivery.

The main brackets 30 may fix the respective bosses 10 to the back surface of the chassis base 4, and may inhibit the external force applied to the chassis base 4 via the bosses 10. The main brackets 30 may be fixed to the back surface of the chassis base 4 (and more specifically, to the corner portions of the chassis base 4 where the respective bosses 10 are provided) via screws or other attachment means to hold the respective bosses 10. In one exemplary embodiment, when viewed in the longitudinal direction of the main bracket 30 (in the x axis direction), the main bracket 30 is oriented in direction of the width of the chassis base 4 (in the x axis direction), and is placed at and raised from the chassis base 4 (that is, in the z axis direction).

Specifically, the respective main brackets 30 may have main bracket coupling portions 31 formed at one or both of the longitudinal ends thereof, and a main bracket bent portion 33 formed between the main bracket coupling portions 31. The respective main bracket coupling portions 31 may contact the back surface of the chassis base 4, and a coupling member such as a screw is coupled thereto. The main bracket bent portion 33 may be spaced from the back surface of the chassis base 4 by a predetermined distance, and the boss 10 may be fitted thereto. The main bracket bent portion 33 may be extended from the main bracket coupling portions 31 in a body, and may be bent toward the rear of the chassis base 4. For example, the main bracket bent portion may be bent in the shape of a staple with one side being open. A fixation hole 35 may be formed at the center of the main bracket bent portion 33 to hold one end of the boss 10. The boss 10 may be fixed to the main bracket 30 by fitting the fixation groove 13 to the main bracket bent portion 33 by pressing the boss into the fixation hole 35 defined on the main bracket bent portion 33.

The main bracket bent portion 33 of the main bracket 30 may be spaced away from the back surface of the chassis base 4 because when the boss 10 is fitted to the fixation hole 35, the fixation end of the boss may be spaced from the back surface of the chassis base 4 to prevent external force applied thereto from being concentrated on the chassis base 4.

Alternatively, in order to prevent external force from being concentrated on the chassis base 4, a fixation structure with a shock absorber operated by hydraulic or pneumatic pressure may be provided separately. The fixation structure may absorb external pressure transmitted to the chassis base 4 via the boss 10. Accordingly, the fixation member of the main bracket 30 may be an appropriate means of attachment and is not limited to being a screw.

The sub-brackets 50 may reinforce the intrinsic structural integrity of the main bracket 30 and may diffuse any stress applied to the boss 10. In one exemplary embodiment, each sub-bracket 50 is placed perpendicular to the main bracket 30 such that the sub-bracket at least partially covers the main bracket 30, and is coupled to the back surface of the chassis base 4 via a coupling member, such as a screw. The sub-bracket 50 may have a structure adapted to receive a boss 10 in the longitudinal direction (in the z axis direction).

Specifically, the sub-bracket 50 may have sub-bracket coupling portions 51 formed at both of the longitudinal ends thereof, and a sub-bracket bent portion 53 formed between the sub-bracket coupling portions 51. The sub-bracket coupling portions 51 may contact the back surface of the chassis base 4 and may have a coupling member, such as a screw, coupled thereto. The sub-bracket bent portion 53 may be spaced from the main bracket bent portion 33 by a predetermined distance, and the boss 10 fitted to the main bracket 30 may penetrate the sub-bracket bent portion 53. The sub-bracket bent portion 53 may extend from the respective sub-bracket coupling portions 51 in a body, and may be bent toward the rear of the chassis base 4 (in the z axis direction). In one exemplary embodiment, the sub-bracket bent portion may be in the shape of a staple with one side being open. An insertion hole 55 may be formed at the center of the sub-bracket bent portion 53 through which the boss 10 fitted to the main bracket 30 may pass. A reinforcing protrusion 57 may be formed at the region of the sub-bracket bent portion 53 defining the insertion hole 55 to further diffuse stress applied to the boss 10. When the boss 10 fitted to the main bracket 30 is inserted through the insertion hole 55, the sub-bracket 50 may primarily diffuse any stress applied to the boss 50 at the insertion hole 55 thereof, and it may also diffuse stress at the reinforcing protrusion 57 thereof.

The sub-bracket bent portion 53 may be spaced from the main bracket bent portion 33 because any force applied to the boss 10 when the boss is inserted through the insertion hole 55 is diffused by the sub-bracket 50.

In order to assemble the main bracket 30 and the sub-bracket 50, the main bracket 30 may be coupled to a corner of the back surface of the chassis base 4 (opposite the PDP 2). Additionally, the end portion of the boss 10 may be fitted to the fixation hole 35 of the main bracket 30. The boss 10 may pass through the insertion hole 55 of the sub-bracket 50, and the sub-bracket 50 may be coupled to the chassis base 4 perpendicular to the main bracket 30.

Then, a front cabinet 8 and a back cover 9 may be combined with the chassis base 4 in a body, thereby completing a plasma display apparatus.

A wall mounting member such as a screw may be coupled to the boss 10 penetrating the back cover 9 through holes 12, and the plasma display apparatus may be mounted on a wall via the wall mounting member.

When the PDP 2 and the chassis base 4 are packaged and delivered to a set maker as a module, the module may be fixed to a fixation member, such as a block-board, by using a coupling member coupled to the boss 20.

Accordingly, when the plasma display apparatus is mounted on a wall, or a PDP module is packaged by fixing it to a block-board, external force concentrated on the chassis base via the boss 10 may be absorbed by the main bracket 30, and stress applied directly to the boss 10 may be diffused by the sub-bracket 50.

As described above with respect to embodiments of the present invention, where a plasma display apparatus is hung on a wall where a PDP and a chassis base are combined together as a module, it is possible to absorb any external force concentrated on the chassis base via the boss, and to diffuse any stress applied to the boss, thereby preventing decoupling of the boss from the bracket or the formation of black spots at the display screen of the PDP, and therefore enhancing the display quality of the apparatus.

Although exemplary embodiments of the present invention have been described in detail hereinabove, it should be clearly understood that many variations and/or modifications of the basic inventive concept herein taught which may appear to those skilled in the art will still fall within the spirit and scope of the present invention, as defined in the appended claims.

What is claimed is:

1. A display apparatus comprising:
   a display panel;
   a chassis base having a first side and a second side opposite to the first side, the chassis base supporting the display panel on the first side;
   one or more bosses;
   one or more main brackets mounted on the second side of the chassis base, the one or more main brackets each adapted to receive a corresponding one of the bosses; and
   one or more corresponding sub-brackets mounted on the second side of the chassis base adjacent to a respective one of the main brackets, the one or more corresponding sub-brackets adapted to receive the corresponding one of the bosses received by the respective one of the main brackets,
   wherein one of the one or more main brackets is provided at each corner of the second side of the chassis base.

2. The display apparatus of claim 1, wherein each of the sub-brackets has a through-hole adapted for receiving the corresponding one of the bosses and a reinforcing protrusion formed around a perimeter of the through-hole.

3. The display apparatus of claim 1, wherein each of the main brackets has a main bracket bent portion spaced from a surface of the chassis base so as to have a fitting portion of the corresponding one of the bosses spaced from the surface of the chassis base, and each of the sub-brackets has a sub-bracket bent portion spaced from the main bracket bent portion of the respective one of the main brackets so as to have an insertion portion of the corresponding one of the bosses spaced from the main bracket bent portion.

4. The display apparatus of claim 1, wherein the main brackets are formed from a metallic material or a plastic material.

5. The display apparatus of claim 1, wherein the sub-brackets are formed from a metallic material or a plastic material.

6. The display apparatus of claim 1, wherein each of the sub-brackets is placed perpendicularly with respect to the respective one of the main brackets.

7. The display apparatus of claim 2, 3, 4 or 5 wherein each of the sub-brackets is placed perpendicularly with respect to the respective one of the main brackets.

8. The display apparatus of claim 1, wherein each of the one or more bosses is tapped with female threads.

9. The display apparatus of claim 1 wherein the display panel is a plasma display panel.

10. A display apparatus comprising:
    a display panel;
    a chassis base having a first side and a second side opposite to the first side, the chassis base supporting the display panel on the first side;
    one or more bosses;
    one or more main brackets mounted on the second side of the chassis base, the one or more main brackets each adapted to receive a corresponding one of the bosses; and one or more corresponding sub-brackets mounted on the second side of the chassis base adjacent to a respective one of the main brackets, the one or more corresponding sub-brackets adapted to receive the corresponding one of the bosses received by the respective one of the main brackets,
    wherein the chassis base is combined with a front cabinet and a back cover into a body, and the one or more bosses penetrate the back cover and protrude therefrom.

11. A display apparatus comprising:
    a display panel;
    a chassis base having a first side and a second side opposite to the first side, the chassis base supporting the display panel on the first side;
    one or more bosses;
    one or more main brackets mounted on the second side of the chassis base, the one or more main brackets each adapted to receive a corresponding one of the bosses; and
    one or more corresponding sub-brackets mounted on the second side of the chassis base adjacent to a respective one of the main brackets, the one or more corresponding sub-brackets adapted to receive the corresponding one of the bosses received by the respective one of the main brackets,
    wherein each of the one or more bosses is tapped with female threads, and
    wherein each of the one or more bosses has a grooved portion fitted to a hole on the main bracket.

12. A stress diffusing support bracket assembly for a mountable structure comprising:
    a boss having a fitting portion and an insertion portion;
    a main bracket mountable on the mountable structure, the main bracket adapted to receive the fitting portion of the boss; and
    a sub-bracket adjacent to the main bracket, the sub-bracket adapted to receive the insertion portion of the boss,
    wherein the sub-bracket is spaced from the main bracket, and
    wherein the fitting portion of the boss comprises a grooved portion adapted to be fitted to a hole on the main bracket bent portion of the main bracket.

13. The support bracket assembly of claim 12, wherein the sub-bracket has a through-hole adapted for receiving the boss and a reinforcing protrusion formed around a perimeter of the through-hole.

14. The support bracket assembly of claim 12, wherein the main bracket has a main bracket bent portion configured to be spaced from a surface of the mountable structure so as to have the fitting portion of the boss spaced from the surface of the mountable structure, and the sub-bracket has a sub-bracket bent portion spaced from the main bracket bent portion of the main bracket so as to have the insertion portion of the boss spaced from the main bracket bent portion.

15. The support bracket assembly of claim 12, wherein the main bracket is formed from a metallic material or a plastic material.

16. The support bracket assembly of claim 12, wherein the sub-bracket is formed from a metallic material or a plastic material.

17. The support bracket assembly of claim 12, wherein the sub-bracket is placed perpendicularly with respect to the main bracket.

18. The support bracket assembly of claim 12, wherein the boss is tapped with female threads.

19. A display apparatus comprising:
   a display panel;
   a chassis base having a first side and a second side opposite to the first side, the chassis base supporting the display panel on the first side;
   one or more first brackets, each of the one or more first brackets having a first opening, and being mounted on the second side of the chassis base;
   one or more second brackets, each of the one or more second brackets having a second opening, and being mounted on the second side of the chassis adjacent to a respective one of the one or more first brackets, wherein the first and second openings are aligned with each other; and
   one or more bosses, each of the one or more bosses having an end fitted to the first opening, and protruding through the second opening to extend externally from the display apparatus, wherein the one or more bosses are adapted to engage an external structure to mount the display apparatus on the external structures,
   wherein one of the one or more first brackets is provided at each corner of the second side of the chassis base.

* * * * *